United States Patent [19]

Truebenbach

[11] Patent Number: 5,727,021
[45] Date of Patent: Mar. 10, 1998

[54] APPARATUS AND METHOD FOR PROVIDING A PROGRAMMABLE DELAY WITH LOW FIXED DELAY

[75] Inventor: Eric L. Truebenbach, Sudbury, Mass.

[73] Assignee: Teradyne, Inc., Boston, Mass.

[21] Appl. No.: 627,858

[22] Filed: Apr. 3, 1996

[51] Int. Cl.$^6$ .................................................. H04B 17/00
[52] U.S. Cl. ........................... 375/226; 327/395; 371/1
[58] Field of Search ..................... 371/1, 20.1; 327/392, 327/395, 396, 400, 401; 375/224, 226, 371; 370/241, 517

[56] References Cited

U.S. PATENT DOCUMENTS

| | | | |
|---|---|---|---|
| 4,231,104 | 10/1980 | St. Clair | 364/900 |
| 4,637,018 | 1/1987 | Flora et al. | 371/1 |
| 4,700,347 | 10/1987 | Rettberg et al. | 327/395 |
| 5,274,796 | 12/1993 | Conner | 395/550 |
| 5,313,501 | 5/1994 | Thacker | 375/371 |
| 5,469,477 | 11/1995 | Holmberg | 375/371 |

OTHER PUBLICATIONS

U.S. Patent Application, In re: Muething et al., Ser. No. 08/510,079, Filed: Aug. 1, 1995, For: Low Cost CMOS Tester, Group: 2213.

*Primary Examiner*—Benedict V. Safourek
*Attorney, Agent, or Firm*—Richard E. Gamache

[57] ABSTRACT

A printed circuit board tester that compensates for the different propagation length of each channel including a single-input delay cell, at least one multiple-input delay cell, and a multiplexor. The delay cells are connected to one another in a chain. Further, the single-input delay cell is the first delay cell in the chain, and each multiple-input delay cell has the ability to select one of its inputs. A timing signal is applied to each delay cell, and to the multiplexor. The inputs of the multiple-input delay cells are connected to the output of the single-input delay cell, and to the outputs of any preceding multiple-input delay cells in the chain. The single-input delay cell delays the timing signal. Each multiple-input delay cell is programmed by the tester to select one of its inputs; it then delays the selected input. Finally, the multiplexor is programmed by the tester to select either the timing signal or one of the outputs of the delay cells. The signal selected by the multiplexor is the timing signal delayed by an amount necessary to compensate for the propagation length of the channel.

12 Claims, 7 Drawing Sheets

APPARATUS AND METHOD FOR PROVIDING A PROGRAMMABLE DELAY WITH LOW FIXED DELAY

BACKGROUND OF THE INVENTION

This invention relates generally to automatic test equipment, and more particularly to deskew circuitry used in automatic test equipment.

Manufacturers of printed circuit boards commonly use automatic test equipment (also known as "testers") to determine whether the printed circuit boards contain manufacturing defects. Testers typically include computerized control circuitry, driver and receiver channels, and tester pins. The tester pins connect the electrical nodes of the printed circuit board under test (BUT) to the driver and receiver channels of the tester.

During a typical test session, testers apply test signals to the BUT, and receive and evaluate output signals produced by the BUT. Both the test signals, and the output signals which the tester expects to receive from the BUT, are specified by a series of test vectors.

A typical test vector is in digital form, and provides information about the data value, timing, and format of either a test signal or an expected output signal. For example, the data value of a signal during a particular time interval may be specified as either high or low, the signal timing may be specified as a delay relative to the beginning of the test cycle, and the format may indicate that the signal is to be either applied to or observed at a node of the BUT.

The timing of both the test signals and the output signals may also be affected by the propagation delay associated with each driver and receiver channel. Because the propagation delays of the channels may vary, each driver and receiver channel generally includes "deskew" circuitry. The deskew circuitry provides a programmable delay which may be specified so that the resulting propagation delay of each driver and receiver channel is the same. This ensures that the tester both applies the test signals and receives the output signals at the proper times, relative to the beginning of the test cycle.

Figure 1A:
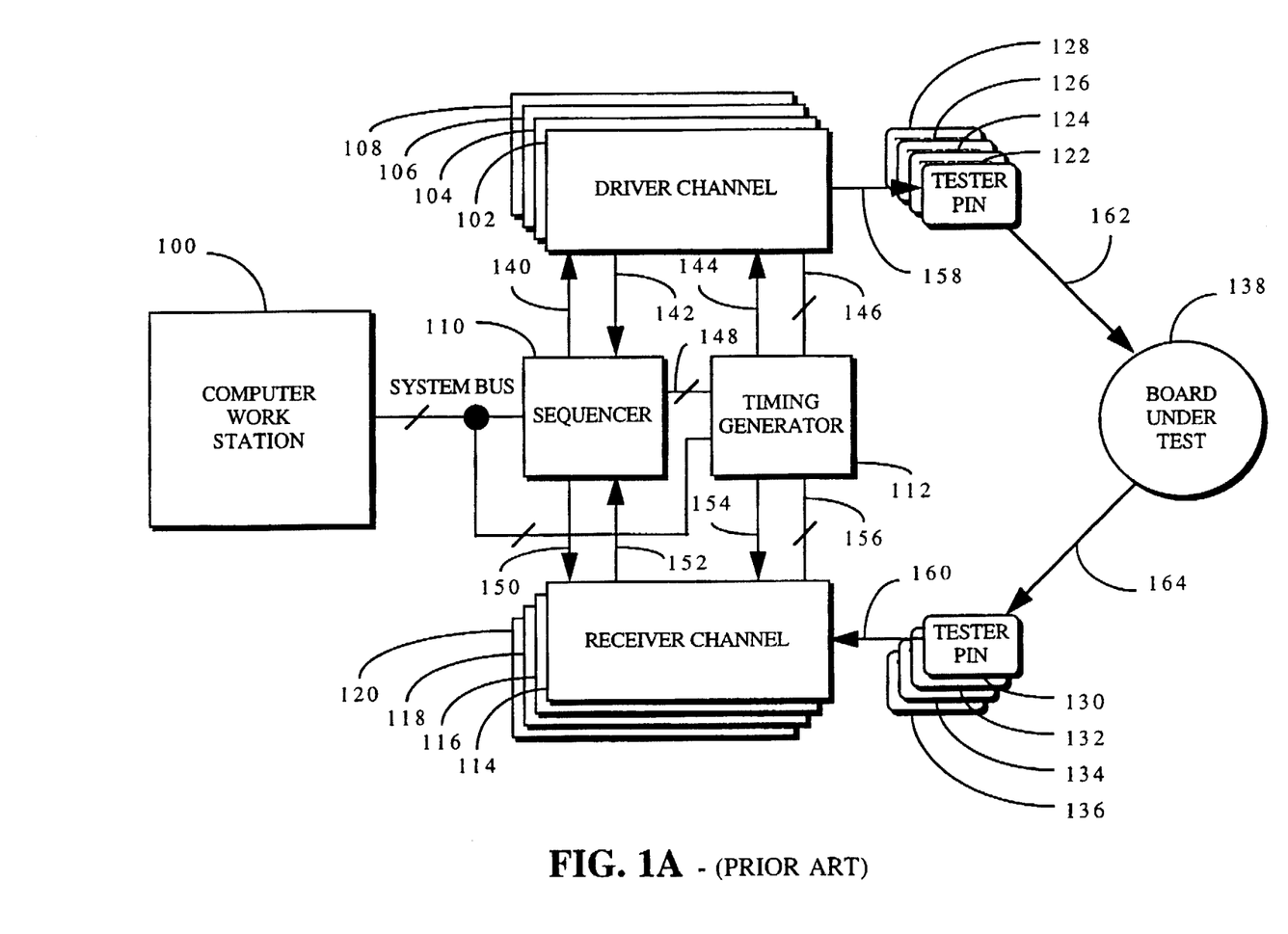
FIG. 1A is a block diagram of a tester in a typical test configuration.

FIG. 1A shows a block diagram of a tester in a typical test configuration. A human test engineer develops a test program, comprised of a series of test vectors, on computer work station 100. The test engineer then loads the test program into the memory (not shown) of sequencer 110 using SYSTEM BUS.

Sequencer 110 executes the test program and sends control signals to driver channels 102, 104, 106, and 108, receiver channels 114, 116, 118, and 120, and timing generator 112. Timing generator 112 produces multiple timing signals, and provides them to driver channels 102, 104, 106, and 108, and receiver channels 114, 116, 118, and 120. Consequently, multiple driver or receiver channels may either use the same timing signal, or use different timing signals, depending upon the requirements of the test session. Finally, tester pins 122, 124, 126, and 128 connect driver channels 102, 104, 106, and 108, respectively, to a set of nodes of BUT 138. Similarly, tester pins 130, 132, 134, and 136 connect receiver channels 114, 116, 118, and 120, respectively, to another set of nodes of BUT 138.

In a typical mode of operation, sequencer 110 sends control signals to driver channel 102 using line 140. Sequencer 110 also sends control signals to receiver channel 114 using line 150. The test program includes test vectors which specify the characteristics of both the test signal to be generated by driver channel 102, and the output signal which receiver channel 114 expects to observe at a node of BUT 138. Additionally, timing generator 112 sends timing signals using lines 144 and 154, and control signals using lines 146 and 156, to driver channel 102 and receiver channel 114, respectively. Finally, tester pin 122 connects driver channel 102 to a node of BUT 138, and tester pin 130 connects receiver channel 114 to another node of BUT 138.

Figure 1B:
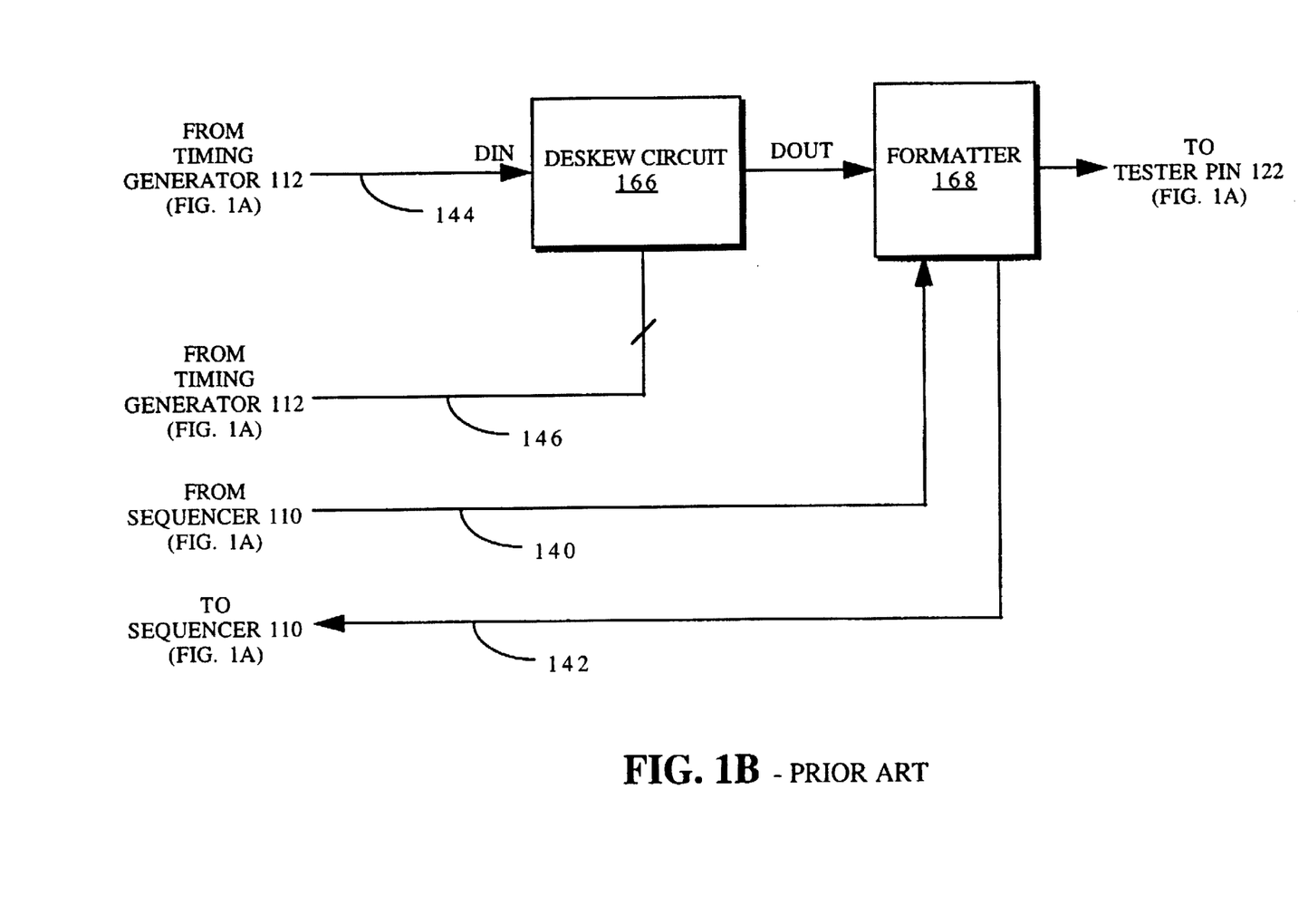
FIG. 1B is a block diagram of the driver channel used with FIG. 1A.

Turning to FIG. 1B, a block diagram of driver channel 102 is shown. Receiver channel 114 contains similar blocks. Timing generator 112 sends timing signals using line 144, and control signals using line 146, to deskew circuit 166. Further, sequencer 110 sends control signals to formatter 168 using line 140, and receives information from formatter 168 using line 142.

Deskew circuit 166 adds a sufficient amount of delay to the timing signals to compensate for the propagation delay of driver channel 102, thereby maintaining the proper timing relationships between timing signals used by different channels. Formatter 168 contains the driver and comparator circuitry needed to perform input and output operations during a test session. In a driver channel, formatter 168 may receive a timing signal from deskew circuit 166 that either causes an output driver to start driving an output, or causes the output driver to stop driving the output. In a receiver channel, formatter 168 may receive a timing signal that either causes a comparator to start comparing an output signal produced by BUT 138 with an expected value, or causes the comparator to stop the comparison.

When verifying the integrity of a printed circuit board, it is very important for a tester to react quickly to the electronic signals produced by the BUT. There are two reasons for this. First, a typical BUT contains circuitry which allows the BUT to control its own system timing. As a result, the tester has limited control over the timing of the BUT. Second, a typical BUT communicates with the outside world through interface circuitry, which may consist of an asynchronous, serial communications bus. The interface circuitry also has timing specifications which describe the electronic "handshaking" that must occur for error-free communications between the tester and the BUT. Consequently, the tester must respond fast enough to signals produced by the BUT to satisfy the requirements of the interface circuitry timing specifications. If the required handshaking cannot be achieved between the tester and the BUT, then the tester will not be able to determine successfully whether the BUT has manufacturing defects.

One way to decrease the amount of time required for a tester to react to a signal produced by the BUT is to decrease the amount of fixed delay associated with the deskew circuitry.

Figure 1C:
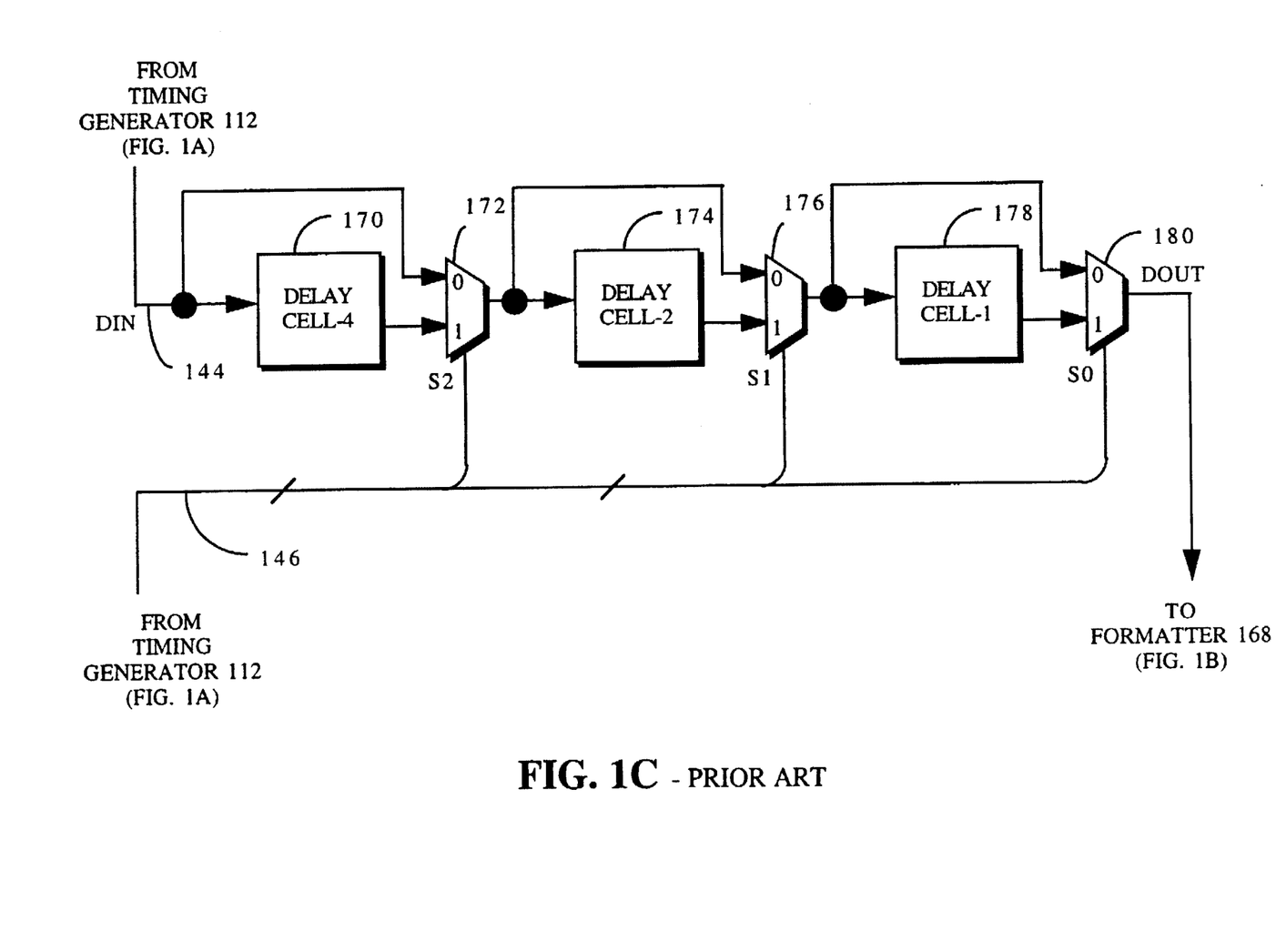
FIG. 1C is a block diagram of a prior art deskew circuit used with FIG. 1B.

FIG. 1C shows one approach to implementing deskew circuit 166. The deskew circuit illustrated in FIG. 1C has three stages. Each stage consists of a binary-weighted delay cell and a two-input multiplexor, such as delay cell-4 and multiplexor 172.

The delay cells may be implemented using CMOS technology. Further, the delay cells typically consist of multiple CMOS inverter pairs connected in series. Different delay values may be obtained for each delay cell by stringing together different numbers of CMOS inverter pairs. Additionally, delay cell-4, delay cell-2, and delay cell-1 are binary-weighted such that the total delay provided by delay cell-2 is preferably twice that of delay cell-1, and the total delay provided by delay cell-4 is preferably four times that of delay cell-1. If we designate the delay value corresponding to delay cell-1 as one unit delay, or "du," then the delay values corresponding to delay cell-2 and delay cell-4 are 2du and 4du, respectively.

Multiplexor 172, multiplexor 176, and multiplexor 180 may also be implemented using CMOS technology. Further, because multiplexor 172, multiplexor 176, and multiplexor 180 each contain the same circuitry, it is assumed that each multiplexor has the same propagation delay. We shall designate the propagation delay through each multiplexor as one fixed delay, or "df." Finally, multiplexors 172, 176, and 180 have select inputs S2, S1, and S0, respectively. If the logical value of a select input is low, then the corresponding multiplexor will select the signal applied to its "0" input. Similarly, if the logical value of a select input is high, then the corresponding multiplexor will select the signal applied to its "1" input.

The deskew circuit shown in FIG. 1C may be programmed to provide eight different propagation delay values. For example, when select inputs S0, S1, and S2 equal 0, 0, and 0, respectively, multiplexor 172, multiplexor 176, and multiplexor 180 select the signals applied to their "0" inputs. It follows that the resulting propagation delay of the circuit equals the sum of the propagation delays of multiplexors 172, 176, and 180, or 3df. Similarly, when select inputs S0, S1, and S2 equal 1, 1, and 1, respectively, multiplexors 172, 176, and 180 select the signals applied to their "1" inputs. It then follows that the resulting propagation delay equals the sum of the propagation delays of delay cell-4, multiplexor 172, delay cell-2, multiplexor 176, delay cell-1, and multiplexor 180, or (7du+3dr). TABLE I indicates what logical values should be applied to S0, S1, and S2 to obtain the eight propagation delay values.

TABLE I

| S2 | S1 | S0 | DELAY VALUE |
|----|----|----|-------------|
| 0  | 0  | 0  | 3df         |
| 0  | 0  | 1  | du + 3df    |
| 0  | 1  | 0  | 2du + 3df   |
| 0  | 1  | 1  | 3du + 3df   |
| 1  | 0  | 0  | 4du + 3df   |
| 1  | 0  | 1  | 5du + 3df   |
| 1  | 1  | 0  | 6du + 3df   |
| 1  | 1  | 1  | 7du + 3df   |

The deskew circuit may be laid out such that no devices are required to drive a large signal trace load. Further, the delay of delay cell-1, delay cell-2, and delay cell-4 may be increased either by adding more inverter pairs to the string of inverter pairs in each cell, or by adding metal to the outputs of the inverters, thereby increasing the capacitance of the signal path.

However, the deskew circuit depicted in FIG. 1C has a drawback: that is, a substantial fixed propagation delay value, equal to 3df, is included in each of the eight different delay configurations. This fixed delay increases the amount of time required for the tester to respond to a signal produced by the BUT, thereby making it difficult to satisfy the bus specifications of the BUT.

Figure 1D:
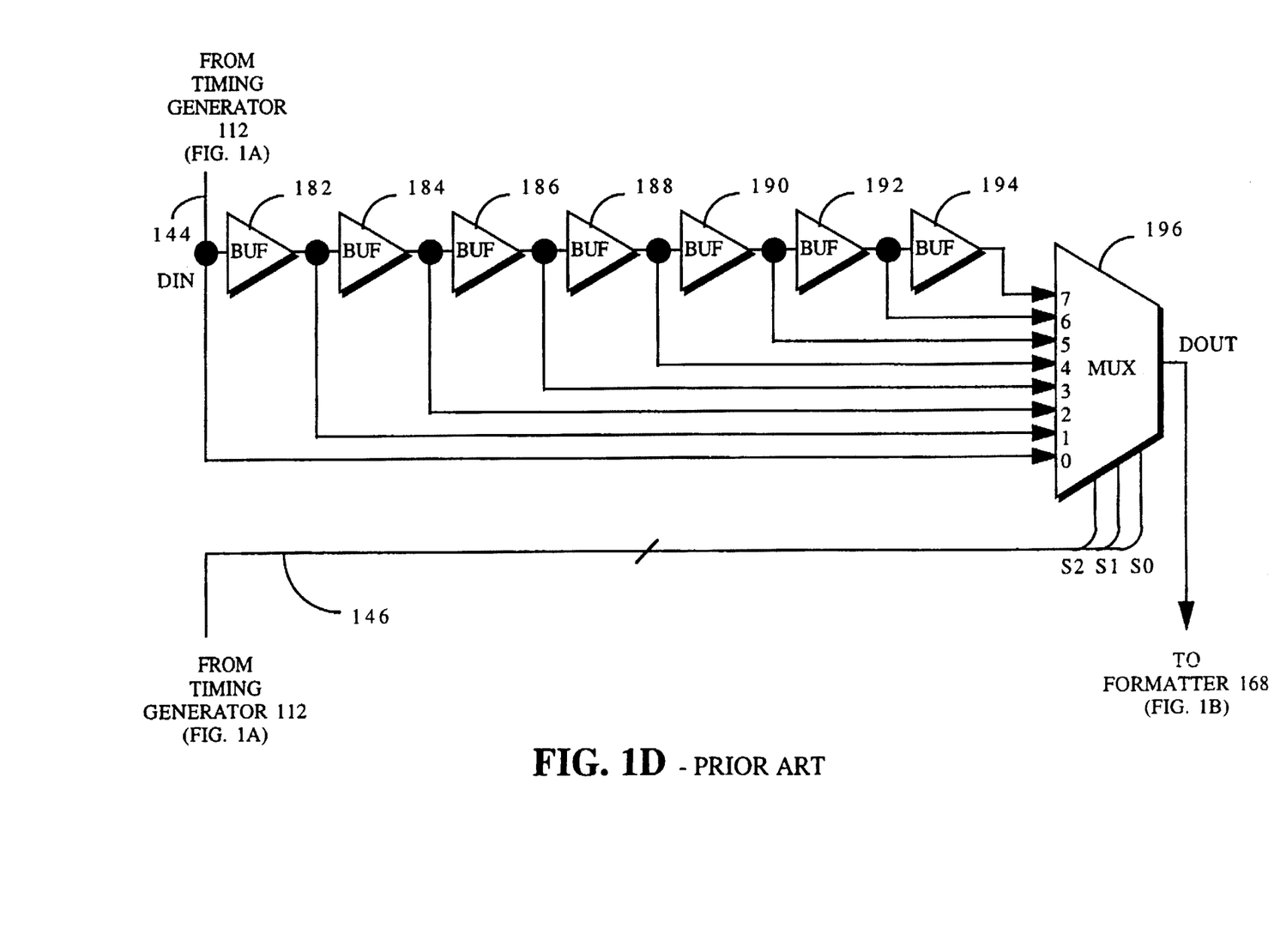
FIG. 1D is a block diagram of another prior art deskew circuit used with FIG. 1B.

FIG. 1D shows another approach to implementing deskew circuit 166. The deskew circuit of FIG. 1D is a linear delay line consisting of a string of seven buffer circuits, and an eight-input multiplexor.

The buffer circuits may be implemented using one or more CMOS inverter pairs connected together in series. Buffer circuits 182, 184, 186, 188, 190, 192, and 194 are each designed to provide the same amount of propagation delay. We shall designate the propagation delay provided by each buffer circuit as one unit delay, or "du."

Multiplexor 196 may be implemented using CMOS technology. Once again, we shall designate the propagation delay through multiplexor 196 as one fixed delay, or "df." Multiplexor 196 also contains circuitry which decodes select inputs S2, S1, and S0 so that each combination of logical values applied to S2, S1, and S0 will select a unique input of multiplexor 196.

The deskew circuit shown in FIG. 1D may be programmed to provide eight different propagation delay values. For example, when select inputs S0, S1, and S2 equal 0, 0, and 0, respectively, multiplexor 196 selects the signal applied to its "0" input. It follows that the resulting propagation delay of the circuit equals the propagation delay of multiplexor 196, or df. Similarly, when select inputs S0, S1, and S2 equal 1, 1, and 1, respectively, multiplexor 196 selects the signal applied to its "7" input. It follows that the resulting propagation delay equals the sum of the propagation delays of buffer 182, buffer 184, buffer 186, buffer 188, buffer 190, buffer 192, buffer 194, and multiplexor 196, or (7df+dr). TABLE II indicates what logical values should be applied to S0, S1, and S2 to obtain the eight propagation delay values.

TABLE II

| S2 | S1 | S0 | DELAY VALUE |
|----|----|----|-------------|
| 0  | 0  | 0  | df          |
| 0  | 0  | 1  | du + df     |
| 0  | 1  | 0  | 2du + df    |
| 0  | 1  | 1  | 3du + df    |
| 1  | 0  | 0  | 4du + df    |
| 1  | 0  | 1  | 5du + df    |
| 1  | 1  | 0  | 6du + df    |
| 1  | 1  | 1  | 7du + df    |

Although the fixed propagation delay value associated with the deskew circuit shown in FIG. 1D is one-third of the fixed delay value associated with the deskew circuit shown in FIG. 1C, the deskew circuit of FIG. 1D has a drawback. For example, as buffer circuits are added to the deskew circuit, the signal traces connecting the added buffer circuits to multiplexor 196 must be made longer. As a result, the additional buffer circuits are required to drive larger signal trace loads. These substantial trace loads increase the capacitance of the signal path, and make it difficult to adjust accurately the propagation delays of the individual buffer circuits.

Although the techniques described above have been successfully used in the deskew circuits of testers to adjust the overall propagation delay of the driver and receiver channels, it would be desirable to have a tester that both compensates for the different propagation length of each channel, and satisfies the bus specifications of the printed circuit board under test. It would also be desirable to have a tester with a deskew circuit that is programmable, has a low fixed delay, and is capable of providing a wide range of delay values.

SUMMARY OF THE INVENTION

With the foregoing background in mind, it is an object of the invention to provide a tester, with deskew circuitry, that has the ability to respond rapidly to signals generated by a printed circuit board under test, while compensating for the different propagation length of each channel.

Another object of the invention is to provide a tester which includes deskew circuitry that is programmable, is capable of providing a wide range of delay values, and has a low fixed propagation delay value.

The foregoing and other objects are achieved in a printed circuit board tester having programmable deskew circuitry in each channel. The programmable deskew circuitry includes a plurality of delay cells connected to one another in a chain, and a multiplexor. The plurality of delay cells includes a single-input delay cell which is the first delay cell in the chain, and at least one multiple-input delay cell having a means for selecting one of its inputs.

In a preferred embodiment, a timing signal is applied to each delay cell, and the multiplexor. The inputs of the multiple-input delay cells are connected to the output of the single-input delay cell, and to the outputs of the preceding multiple-input delay cells in the chain, if any. The single-input delay cell delays the timing signal in accordance with its delay value. Each multiple-input delay cell is programmed such that it selects an input, and then delays the selected input in accordance with its delay value. Finally, the multiplexor is programmed to select either the timing signal, or one of the outputs of the delay cells. The signal selected by the multiplexor is the timing signal delayed by an amount necessary to compensate for the propagation length of the channel.

In accordance with another feature of the invention, a linear delay line is connected to the output of the deskew circuit.

Still further objects and advantages will become apparent from a consideration of the ensuing description and drawings.

BRIEF DESCRIPTION OF THE DRAWINGS

The invention will be better understood by reference to the following more detailed description and accompanying drawings in which.

DESCRIPTION OF THE PREFERRED EMBODIMENT

Figure 2A:
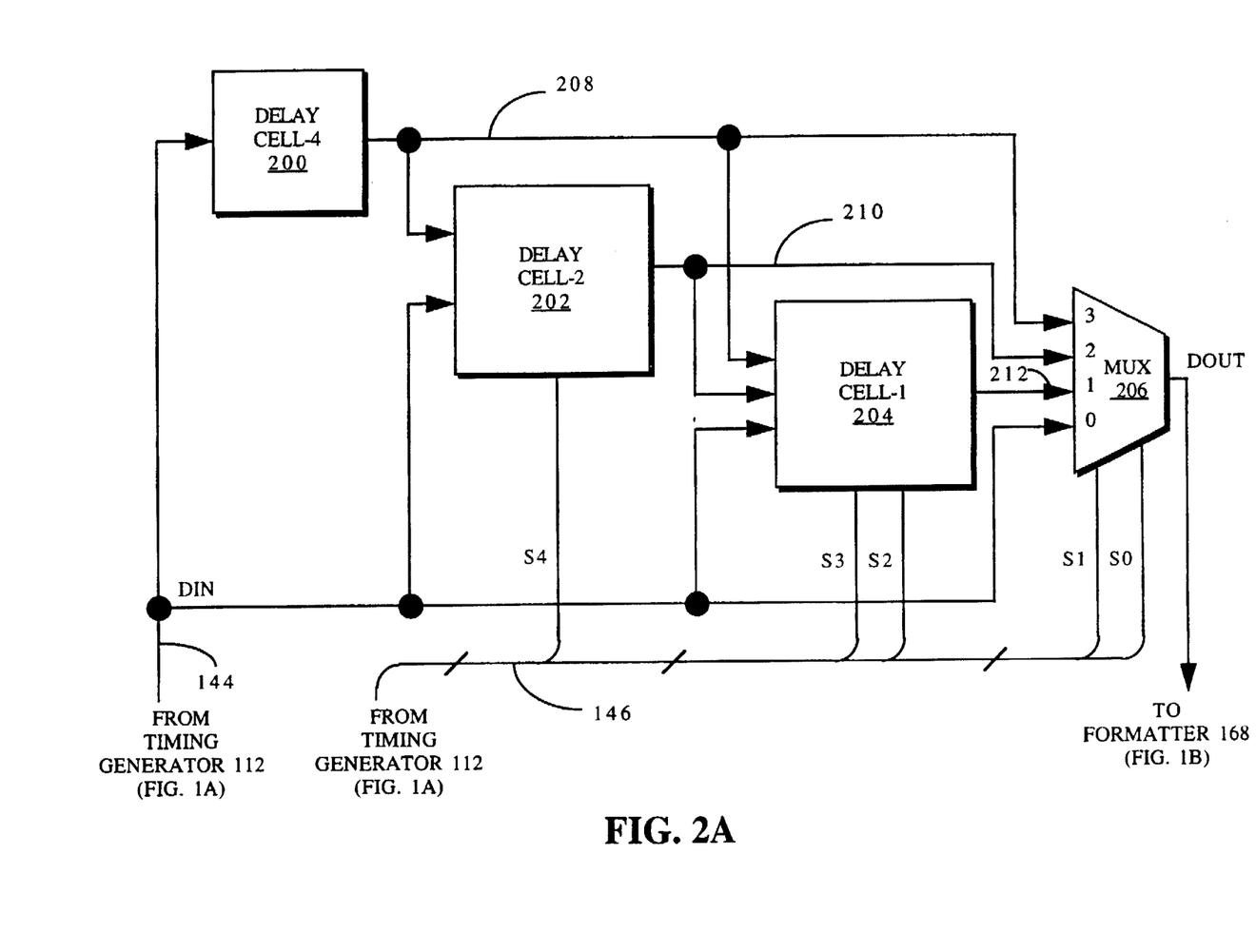
FIG. 2A is a block diagram of a deskew circuit according to the present invention.

FIG. 2A shows a preferred embodiment of the deskew circuit of the present invention. The deskew circuit generally includes multiple delay cells, such as delay cell-4, delay cell-2, and delay cell-1. It is important to note that the total number of delay cells used in the deskew circuit of FIG. 2A is not limited to three. Additional delay cells may be added to achieve a wider range of propagation delay values. The deskew circuit shown in FIG. 2A is a typical configuration.

Delay cell-4, delay cell-2, and delay cell-1 are binary-weighted such that the total delay provided by delay cell-2 is preferably twice that of delay cell-1, and the total delay provided by delay cell-4 is preferably four times that of delay cell-1. If we designate the propagation delay value corresponding to delay cell-1 as one unit delay, or "du," then the delay values corresponding to delay cell-2 and delay cell-4 are 2du and 4du, respectively.

Figure 2B:
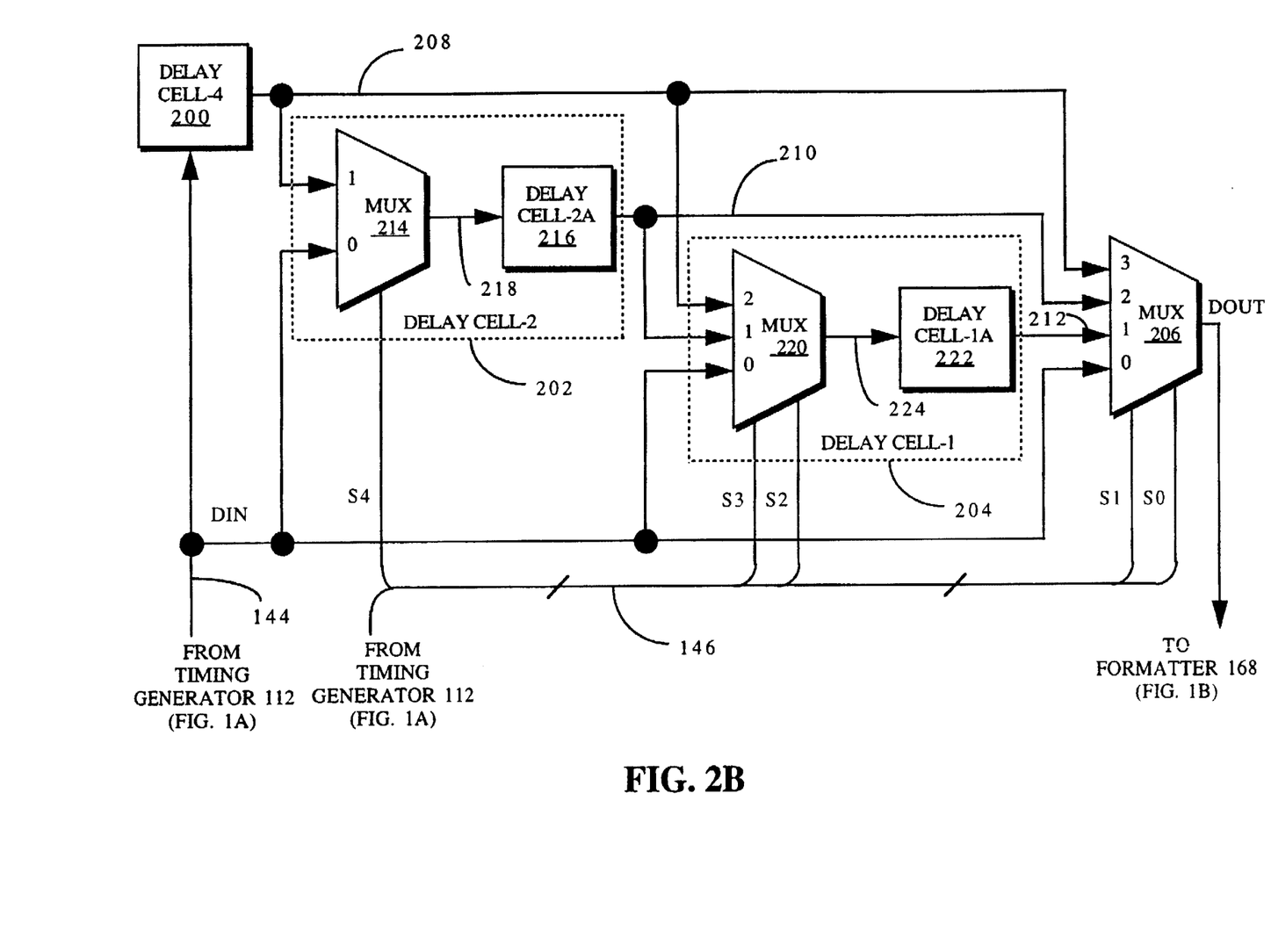
FIG. 2B is a detailed block diagram of the deskew circuit shown in FIG. 2A.

Turning to FIG. 2B, delay cell-2 and delay cell-1 are shown in greater detail. Delay cell-2 consists of multiplexor 214 and delay cell-2A. Similarly, delay cell-1 consists of multiplexor 220 and delay cell-1A.

Delay cell-1A, delay cell-2A, and delay cell-4 may be implemented using CMOS technology. Accordingly, delay cell-1A, delay cell-2A, and delay cell-4 generally consist of multiple CMOS inverter pairs (not shown) connected together in series.

The delay of delay cell-1A, delay cell-2A, and delay cell-4 may be adjusted by first either adding or removing CMOS inverter pairs to obtain a coarse adjustment, and then by adding metal at the outputs of the inverters, thereby increasing the capacitance of the signal path, to obtain a fine adjustment. Many other design techniques for adjusting delay are known. The deskew circuit of the present invention is typically implemented using a double-metal CMOS process.

Multiplexor 214, multiplexor 220, and multiplexor 206 may also be implemented using CMOS technology. Each multiplexor consists of at least two inputs, an output, and at least one select input. For example, multiplexor 214 has line 208 and signal DIN as inputs, line 218 as an output, and signal S4 as a select input.

The input section of each multiplexor circuit is typically made with multiple n-channel transistors (not shown). For example, the sources of the n-channel transistors are connected together, and the drains of the n-channel transistors serve as the inputs of the multiplexor. Accordingly, the number of n-channel transistors in the input section of a multiplexor is equal to the number of inputs of the multiplexor.

The output section of each multiplexor typically consists of a CMOS inverter pair (not shown). The input of the CMOS inverter pair is connected to the point of connection of the multiple n-channel transistors of the input section, and the output of the CMOS inverter pair serves as the output of the multiplexor.

The advantages of implementing the multiplexor circuitry in CMOS are that the propagation delays from the inputs to the output are usually the same, and it is easy to add more inputs to the multiplexor. We shall designate the propagation delay through each multiplexor as "df."

The inputs of each multiplexor are selected by applying a logical high voltage to the gate of the corresponding n-channel transistor. Multiplexor 214, multiplexor 220, and multiplexor 206 each have circuitry (not shown) which decodes the select inputs so that each logical combination of select inputs causes a logical high voltage to be applied to the gate of a unique n-channel input transistor. The selected input is then passed on to the multiplexor output.

The select inputs to multiplexor 214, multiplexor 220, and multiplexor 206 are decoded as follows. If the logical value of select input S4 is low, then multiplexor 214 will select the signal applied to its "0" input. Further, if the logical value of select input S4 is high, then multiplexor 214 will select the signal applied to its "1" input. Similarly, if select inputs (S3,S2) are equal to (0,0), (0,1), and (1,0), then multiplexor 220 will select the signals applied to its "0" input, its "1" input, and its "2" input, respectively. Finally, if select inputs (S1,S0) are equal to (0,0), (0,1), (1,0), and (1,1), then multiplexor 206 will select the signals applied to its "0" input, its "1" input, its "2" input, and its "3" input, respectively.

Although the speed of the decode circuitry in each multiplexor is relatively slow, the performance of the present invention is not adversely affected. This is because after the test engineer determines the desired delay value for each deskew circuit, the test engineer will usually program each multiplexor accordingly, and then leave the multiplexors in their programmed state for an extended period of time.

As shown in FIG. 2B, the input signal, DIN, is applied to the input of delay cell-4, and to the "0" inputs of multiplexor 214, multiplexor 220, and multiplexor 206. The output of delay cell-4 is applied to the "1" input of multiplexor 214, the "2" input of multiplexor 220, and the "3" input of multiplexor 206. Further, the output of delay cell-2A is applied to the "1" input of multiplexor 220, and the "2" input of multiplexor 206. Additionally, the output of delay cell-1A is applied to the "1" input of multiplexor 206. The deskew circuit of the present invention is completed by connecting the output of multiplexor 214 to the input of delay cell-2A, and by connecting the output of multiplexor 220 to the input of delay cell-1A.

As noted above, delay cell-4, delay cell-2 and delay cell-1 are binary-weighted. As a result, the delay provided by delay cell-2 is preferably twice that of delay cell-1, or 2du, and the delay provided by delay cell-4 is preferably four times that of delay cell-1, or 4du.

The propagation delay of delay cell-1A may be adjusted in accordance with both the desired unit delay value, du, and the desired range of programmable delay values. The propagation delays of delay cell-2A and delay cell-4 may then be determined as follows. The propagation delay of delay cell-2 is preferably twice that of delay cell-1. This means that the propagation delay of delay cell-2A is preferably two times the combined delay of multiplexor 220 and delay cell-1A, minus the delay of multiplexor 214, or (2du−df). Further, the propagation delay of delay cell-4 is preferably four times that of delay cell-1. This means that the propagation delay of delay cell-4 is preferably four times the combined delay of multiplexor 220 and delay cell-1A, or 4du.

The deskew circuit shown in FIG. 2B may be programmed to provide eight different propagation delay values, depending upon the logical values of select inputs S0, S1, S2, S3, and S4. For example, when select inputs S0 and S1 equal 0 and 0, respectively, multiplexor 206 selects the signal applied to its "0" input. It follows that the resulting propagation delay equals the propagation delay of multiplexor 206, or df. Similarly, when select inputs S0, S1, S2, S3, and S4 equal 1, 0, 1, 0, and 1, respectively, multiplexors 214, 220, and 206 each selects the signal applied to its "1" input. It follows that the resulting propagation delay equals the sum of the propagation delays of delay cell-4, delay cell-2, delay cell-1, and multiplexor 206, or (7du+df). TABLE III indicates what logical values should be applied to S0, S1, S2, S3, and S4 in order to obtain the eight possible delay values.

TABLE III

| S4 | S3 | S2 | S1 | S0 | DELAY VALUE |
|----|----|----|----|----|-------------|
| X  | X  | X  | 0  | 0  | df          |
| X  | 0  | 0  | 0  | 1  | du + df     |
| 0  | X  | X  | 1  | 0  | 2du + df    |
| 0  | 0  | 1  | 0  | 1  | 3du + df    |
| X  | X  | X  | 1  | 1  | 4du + df    |
| X  | 1  | 0  | 0  | 1  | 5du + df    |
| 1  | X  | X  | 1  | 0  | 6du + df    |
| 1  | 0  | 1  | 0  | 1  | 7du + df    |

In TABLE III, a "0" and a "1" correspond to a logical low voltage and a logical high voltage, respectively. Further, an "X" corresponds to a "don't care" value; that is, the associated signal may be either a logical low or a logical high.

The propagation delays of delay cell-1A, delay cell-2A, and delay cell-4 may be increased either by adding more inverter pairs to the string of inverter pairs in each cell, or by adding metal to the outputs of the inverters. This is because the signal traces connecting delay cell-4, delay cell-2, delay cell-1, and multiplexor 206 can be made relatively short, and the resulting signal trace loads do not increase the capacitance of the signal path to the point where the accuracy of the timing adjustments is adversely affected.

In the prior art deskew circuit shown in FIG. 1C, it is easy to adjust the timing of the individual delay cells. However, the deskew circuit has a substantial fixed propagation delay value equal to 3df. In contrast, the prior art deskew circuit shown in FIG. 1D has a small fixed propagation delay value equal to df. However, it is not easy to adjust the timing of the individual buffer circuits in the deskew circuit because as the deskew circuit is made larger, the buffer circuits are required to drive larger signal trace loads. An important advantage of the present invention is the ability to adjust accurately the timing of the individual delay cells, while maintaining a small fixed propagation delay value, df. This is because the propagation delays of multiplexor 214 and multiplexor 220 are incorporated into the overall delays of delay cell-2 and delay cell-1, respectively. As a result, the delays of multiplexor 214 and multiplexor 220 are not included in the fixed propagation delay of the deskew circuit.

For some test sessions, delay cell-1 in FIG. 2B may not yield a unit delay value, du, that is small enough. In this case, a linear delay line may be used in conjunction with the deskew circuit of the present invention to achieve a smaller unit delay value.

Figure 2C:
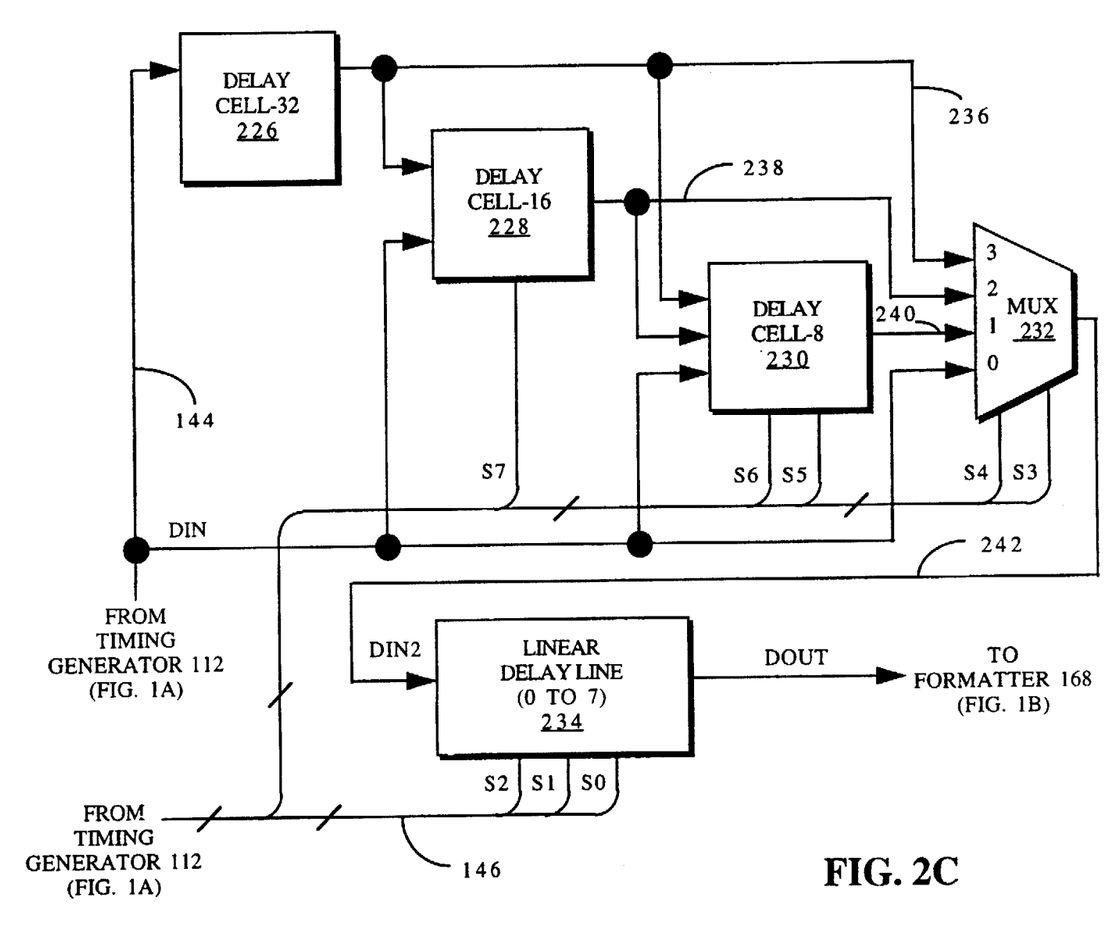
FIG. 2C shows an alternative embodiment of the present invention that includes a linear delay line.

Turning to FIG. 2C, linear delay line 234 is connected to multiplexor 232. Linear delay line 234 is identical to the prior art deskew circuit shown in FIG. 1D. The deskew circuit shown in FIG. 2C has the advantage of having higher order delay cells that are easily adjustable, such as delay cell-32, delay cell-16, and delay cell-8, while having a small unit delay value. The unit delay value is equal to the propagation delay of one buffer circuit, such as buffer circuit 182 of FIG. 1D.

However, whereas the fixed propagation delay value of the deskew circuit shown in FIG. 2B is equal to the delay of one multiplexor, df, the fixed propagation delay value of the deskew circuit shown in FIG. 2C is equal to the delay of two multiplexors, 2df. The fixed delay value consists of the propagation delay of multiplexor 232, plus the propagation delay of the eight-input multiplexor (not shown) of linear delay line 234. This eight-input multiplexor is analogous to multiplexor 196 of FIG. 1D. Although the circuit shown in FIG. 2C has a small unit delay value, there is a trade-off in that the circuit has a slightly larger fixed propagation delay value.

Having described one embodiment, numerous alternative embodiments or variations might be made. For example, it is not necessary that CMOS technology be used to implement the deskew circuitry. Other suitable technologies may be used, such as one of the bipolar technologies.

Also, additional delay cells may be incorporated into the deskew circuit to obtain a wider range of programmable delay values.

Also, the number of bits in the select and control signals serves as an illustration. Any number of bits might be used. When the number of bits is changed, the number of inputs for multiplexors 214, 220, and 206 should be changed accordingly. Further, additional multiplexors may be required. Additionally, the length of delay line 234 should be changed accordingly.

Also, it was described that each delay cell consists of multiple CMOS inverter pairs connected together in series. However, this implementation is merely an illustration. Other design techniques for delay cells and delay lines are known. Similarly, the implementation of the input and output sections of each multiplexor serves as an illustration. Other design techniques for multiplexors are known.

Also, it was described that the delay provided by each successive delay cell in a chain of delay cells is preferably twice that of its predecessor. However, exact weightings for the delay cells is not required if the tester can compensate for any differences between the actual and programmed delay values using software.

Also, it was described that the speed of the decode circuitry in each multiplexor is relatively slow. However, the decode circuitry is not required if the select inputs to the multiplexors are decoded using software. In this case, the time needed to decode the select inputs would be very small, and the tester may be able to change the timing of the deskew circuitry on-the-fly.

Also, it should be appreciated that the prior art tester architecture shown in FIG. 1A is merely an illustration. The invention might be used to provide a programmable delay with low fixed delay in a tester of any architecture. The same circuitry might also be used in other applications where a programmable delay with low fixed delay is required.

Therefore, the invention should be limited only by the spirit and scope of the appended claims.

What is claimed is:

1. A deskew circuit for providing a programmable delay, incorporated into each channel of a tester, and used to adjust the propagation delay of each channel, comprising:

(a) an input;
    (b) an output;
    (c) a plurality of delay cells connected to one another in a chain, said plurality of delay cells including a first delay cell and at least one subsequent delay cell, said first delay cell being the first delay cell in the chain,
        each delay cell having an output, a first input connected to the input of the deskew circuit, and a means for delaying an input,
        each at least one subsequent delay cell having at least one additional input connected to the outputs of preceding delay cells in the chain, and a means for selecting between said first input and said at least one additional input in response to a first set of timing control bits; and
    (d) a means for selecting between the input of the deskew circuit and the outputs of the delay cells in response to a second set of timing control bits, said means connected to the output of the deskew circuit.

2. The deskew circuit of claim 1 wherein said means for delaying comprises a first delay line.

3. The deskew circuit of claim 2 wherein each means for selecting comprises a multiplexor having a plurality of inputs and an output.

4. The deskew circuit of claim 3 further comprising a second delay line having an input and an output, said input connected to the output of the deskew circuit.

5. The deskew circuit of claim 4 wherein the second delay line comprises a delay line having a plurality of taps, and a means for selecting the output of one of the taps in response to a third set of timing control bits.

6. A tester having a plurality of channels, adapted to compensate for the different propagation delay of each channel, comprising:

(a) a plurality of test pins, connected to the channels; and
    (b) sequencer means, connected to the channels, for activating the channels to drive selected test pins and to receive electronic signals appearing on selected test pins, wherein each channel includes a programmable deskew circuit comprising
        (i) an input,
        (ii) a plurality of delay cells connected to one another in a chain, said plurality of delay cells including a single-input delay cell and at least one multiple-input delay cell,
            each delay cell having an output,
            said single-input delay cell having an input connected to the input of the deskew circuit, said single-input delay cell being the first delay cell in the chain,
            each multiple-input delay cell having a plurality of inputs and a means for selecting one of the inputs in response to a first set of timing control bits, said plurality of inputs connected to the input of the deskew circuit, the output of the single-input delay cell, and the outputs of the preceding multiple-input delay cells in the chain, if any, and
        (iii) a first multiplexor having a plurality of inputs, an output, and a means for selecting one of the inputs in response to a second set of timing control bits, said plurality of inputs connected to the input of the deskew circuit and the outputs of the plurality of delay cells, wherein said output of the first multiplexor is the output of the deskew circuit.

7. The tester of claim 6 wherein said single-input delay cell comprises a first delay line connected between the input and the output of the single-input delay cell.

8. The tester of claim 7 wherein each multiple-input delay cell comprises a second multiplexor and a second delay line, said second multiplexor having a plurality of inputs and an output, said plurality of inputs of the second multiplexor being the inputs of the multiple-input delay cell, said second delay line connected between the output of the second multiplexor and the output of the multiple-input delay cell.

9. The tester of claim 8 further comprising a third delay line having an input and an output, said input connected to the output of the first multiplexor, the output of the third delay line being the output of the deskew circuit.

10. The tester of claim 9 wherein the third delay line comprises a delay line having a plurality of taps, and a means for selecting the output of one of the taps in response to a third set of timing control bits.

11. The tester of claim 6 used in a method for manufacturing a printed circuit board comprising:

(a) attaching a plurality of electronic components to the printed circuit board;
    (b) mounting at least one electrical connector to the printed circuit board;
    (c) placing the printed circuit board in a test fixture;
    (d) applying power and test signals to the printed circuit board; and
    (e) comparing response signals generated by the printed circuit board with expected response signals to verify the operation of the printed circuit board, thereby determining whether the printed circuit board contains manufacturing defects.

12. A method of operating a tester having a plurality of channels to compensate for the different propagation delay of each channel, each channel having a deskew circuit, said deskew circuit including a plurality of delay cells and a multiplexor, said plurality of delay cells connected to one another in a chain, said plurality of delay cells including a single-input delay cell and at least one multiple-input delay cell, said single-input delay cell and each multiple-input delay cell having an output, comprising:

(a) operating the single-input delay cell to delay a timing signal, thereby producing a first delayed signal;

(b) operating each multiple-input delay cell to select either the timing signal, the first delayed signal, or the output of a preceding multiple-input delay cell in the chain, if any;

(c) operating each multiple-input delay cell to delay the signal selected in step (b), thereby producing at least one second delayed signal; and (d) selecting either the timing signal, the first delayed signal, or the at least one second delayed signal, whereby the signal selected in step (d) is delayed by an amount necessary to compensate for the propagation length of the channel.

* * * * *